United States Patent
Bakir et al.

(10) Patent No.: US 7,468,558 B2
(45) Date of Patent: Dec. 23, 2008

(54) DEVICES HAVING COMPLIANT WAFER-LEVEL INPUT/OUTPUT INTERCONNECTIONS AND PACKAGES USING PILLARS AND METHODS OF FABRICATION THEREOF

(75) Inventors: Muhannad S. Bakir, Atlanta, GA (US); Kevin P. Martin, Atlanta, GA (US); James D. Meindl, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 191 days.

(21) Appl. No.: 11/416,686

(22) Filed: May 3, 2006

(65) Prior Publication Data

US 2006/0209519 A1 Sep. 21, 2006

Related U.S. Application Data

(62) Division of application No. 10/430,670, filed on May 5, 2003, now Pat. No. 7,135,777.

(60) Provisional application No. 60/377,416, filed on May 3, 2002.

(51) Int. Cl.
  *H01L 23/48* (2006.01)
  *H01L 23/52* (2006.01)
  *H01L 29/40* (2006.01)
(52) U.S. Cl. .................. 257/773; 257/774; 257/777; 385/14; 385/15
(58) Field of Classification Search .............. 257/728, 257/758, 773, 774, 777; 385/14, 15, 31
  See application file for complete search history.

(56) References Cited

U.S. PATENT DOCUMENTS

| | | | |
|---|---|---|---|
| 4,380,365 A | 4/1983 | Gross | 350/96.18 |
| 5,046,800 A | 9/1991 | Blyler, Jr. et al. | 385/131 |
| 5,130,356 A | 7/1992 | Feuerherd et al. | 524/96 |
| 5,302,656 A | 4/1994 | Kohara et al. | 524/579 |
| 5,359,208 A | 10/1994 | Katsuki et al. | 257/82 |
| 5,434,196 A | 7/1995 | Ohkawa et al. | 522/100 |
| 5,462,995 A | 10/1995 | Hosaka et al. | 525/332.1 |
| 5,581,414 A | 12/1996 | Snyder | 359/819 |
| 5,896,479 A | 4/1999 | Vladic | 385/59 |
| 6,022,498 A | 2/2000 | Buazza et al. | 264/1.38 |
| 6,039,897 A | 3/2000 | Lochhead et al. | 264/1.24 |
| 6,156,394 A | 12/2000 | Schultz Yamasaki et al. | 427/536 |

(Continued)

OTHER PUBLICATIONS

Chen, et al.: Fully Embedded Board-Level Guided-Wave Optoelectronic Interconnects; Jun. 2000; Proceedings of IEEE, vol. 88, No. 6; pp. 780-793.

(Continued)

*Primary Examiner*—Thien F Tran
(74) *Attorney, Agent, or Firm*—Thomas, Kayden, Horstemeyer & Risley, LLP

(57) ABSTRACT

Devices having one or more of the following: an input/output (I/O) interconnect system, an optical I/O interconnect, an electrical I/O interconnect, a radio frequency I/O interconnect, are disclosed. A representative I/O interconnect system includes a first substrate and a second substrate. The first substrate includes a compliant pillar vertically extending from the first substrate. The compliant pillar is constructed of a first material. The second substrate includes a compliant socket adapted to receive the compliant pillar. The compliant socket is constructed of a second material.

29 Claims, 9 Drawing Sheets

U.S. PATENT DOCUMENTS

| | | | |
|---|---|---|---|
| 6,206,673 B1 | 3/2001 | Lipscomb et al. | 425/174.4 |
| 6,253,004 B1 | 6/2001 | Lee et al. | 385/31 |
| 6,259,567 B1 | 7/2001 | Brown et al. | 359/668 |
| 6,262,414 B1 | 7/2001 | Mitsuhashi | 250/216 |
| 6,272,275 B1 | 8/2001 | Cortright et al. | 385/129 |
| 6,281,508 B1 | 8/2001 | Lee et al. | 250/396 |
| 6,432,328 B2 | 8/2002 | Hamanaka et al. | 264/1.36 |
| 6,500,603 B1 | 12/2002 | Shioda | 430/321 |
| 7,099,525 B2 * | 8/2006 | Bakir et al. | 385/14 |
| 7,135,777 B2 * | 11/2006 | Bakir et al. | 257/773 |
| 2006/0104566 A1 * | 5/2006 | Bakir et al. | 385/14 |

OTHER PUBLICATIONS

Wiesmann, et al.; Singlemode Polymer Waveguides for Optical Backplanes; Dec. 5, 1996; Electronics Letters, vol. 32, No. 25; pp. 2329-2330.

Barry, et al.; Highly Efficient Coupling Between Single-Mode Fiber and Polymer Optical Waveguides; Aug. 1997; IEEE Transactions on Components, Packaging, and Manufacturing Technology—Part B, vol. 20, No. 3; pp. 225-228.

Lee, et al.; Fabrication of Polymeric Large-Core Waveguides for Optical Interconnects Using a Rubber Molding Process; Jan. 2000; IEEE Photonics Technology Letters, vol. 12, No. 1; pp. 62-64.

Schmeider, et al.; Electro-Optical Printed Circuit Board (EOPCB); 2000 Electronic Components and Technoogy Conference; pp. 749-753.

Mederer, et al.; 3Gb/s Data Transmission With GaAs VCSELs Over PCB Integrated Polymer Waveguides; Sep. 2001; IEEE Photonics Technology Letters, vol. 13, No. 9; pp. 1032-1034.

Schröder, et al.; Polymer Optical Interconnects for PCB; 2001; Session 13: Photonic Polymers II; pp. 337-343.

Glukh, et al.; High performance Polymeric Materials for Waveguide Applications; Aug. 2000; SPIE—The International Society for Optical Engineering, inear, Nonlinear, and Power Limiting Organics, San Diego, vol. 4106; pp. 1-11.

Liu, et al.; Plastic VCSEL Array Packaging and High Density Polymer Waveguides for Board and Backplane Optical Interconnect; 1998; Electronic Components and Technology Conference; pp. 999-1005.

Bakir, et al.; Sea of Dual Mode Polymer Pilliar I/O Interconnections for Gigascale Integration; 2003; IEEE International Solid State Circuits Conference; 8 pages.

Beuret, et al.; Microfabrication of 3D Multidirectional Inclined Structure by UV lithography and Electroplating; Micro Electro Mechanical Systems, 1994, MEMS'94, Proceedings, IEEE Workshop on Jan. 25-28, 1994; pp. 81-85.

Wang, et al.; Studies on A Novel Flip-Chip Interconnect Structure-Pillar Bump; Electronic Components and Technology Conference, 2001, Proceedings, 51st, May 1, Jun. 2001; pp. 945-949.

Bakir, et al.; Sea of Polymer Pillars: Dual-Mode Electrical Optical Input/Output Interconnections; in Proc. of Int. Interconnect Technology Conference; pp. 77-79; 2003.

Bakir, et al.; Sea of Polymer Pillars: Compliant Wafer-Level Electrical-Optical Chip I/O Interconnections; IEEE Photonics Technology Letters, vol. 15, No. 11, Nov. 2003; pp. 1567-1569.

Bakir, et al.; Optical Transmission of Polymer Pillars for Chip I/O Optical Interconnections; IEEE Photonics Technology Letters, vol. 16, No. 1, Jan. 2004; pp. 117-119.

Chandrasekhar, et al.; Modeling and Characterization of the Polymer Stud Grid Array (PSGA) Package; Electrical, Thermal and Thermo-Mechanical Qualification; IEEE Transactions on Electronics Packaging Manufacturing, vol. 26, No. 1, Jan. 2003; pp. 54-67.

Bakir, et al.; Optical Transmission of Polymer Pillars for Chip I/O Optical Interconnections; IEEE Photonics Technology Letters; vol. 16, No. 1, Jan. 2004; pp. 117-119.

Bakir, et al.; Sea of Polymer Pillars: Compliant Wafer-Level Electrical-Optical Chip I/O Interconnections; IEEE Photonics Technology Letters, vol. 15, No. 11, Nov. 2003; pp. 1567-1569.

Bakir, et al.; Sea of Polymer Pillars Electrical and Optical Chip I/O Interconnections for Gigascale Intergration; IEEE Transactions on Electron Devices; vol. 51, No. 7; Jul. 2004; pp. 1069-1077.

Bakir, et al.; Integration of Optical Polymer Pillars Chip I/O Interconnections with Si MSM Photodetectors; IEEE Transactions on Electron Devices; vol. 51, No. 7; Jul. 2004; pp. 1084-1090.

W. Wayt Gibbs; Computing at the Speed of Light; Scientific American; Nov. 2004; pp. 81-87.

John Baliga; Polymer Pillars for Optical and Electrical Signals; Semiconductor International; Dec. 2004; p. 36.

Richard Ball; ISSCC: Polymer Pillars Used to Connect Die; Electronics Weekly Archive; Feb. 2003.

Ron Wilson; Session Examines Novel Semiconductor Devices; EE Times; Feb. 12, 2003; URL: http://eetimes.com/article/showArticle.jhtml?articleID=18308034.

* cited by examiner

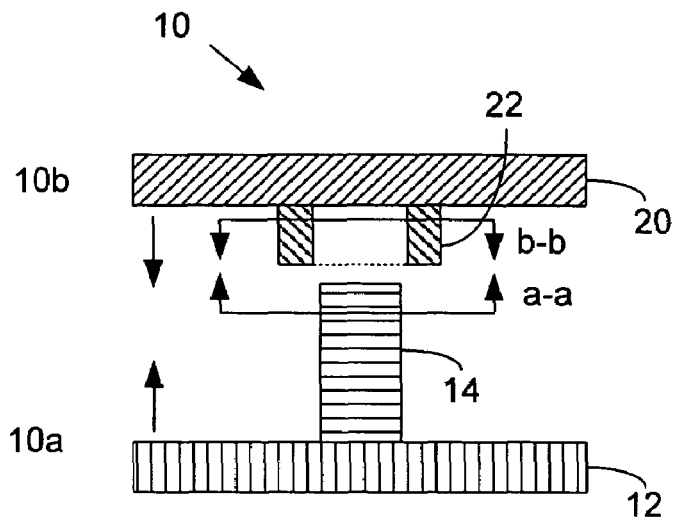
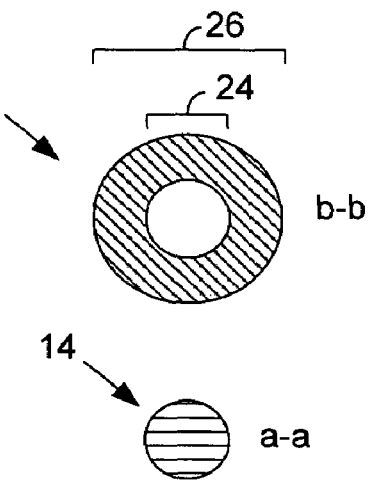
FIG. 1A  FIG. 1B
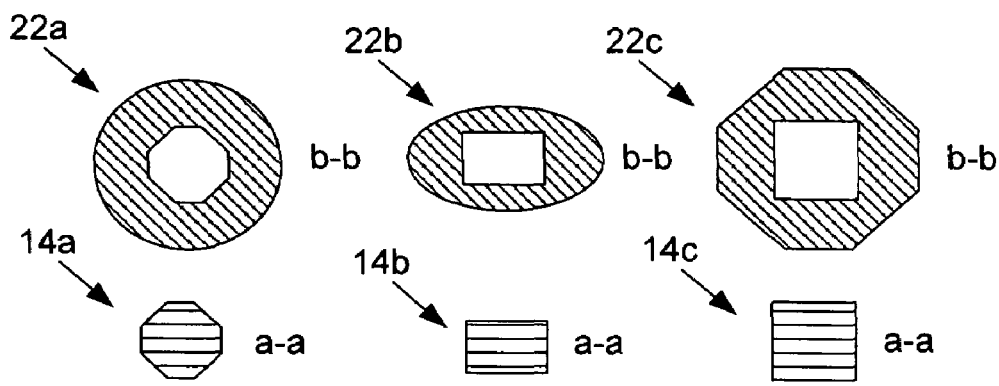
FIG. 2A  FIG. 2B  FIG. 2C
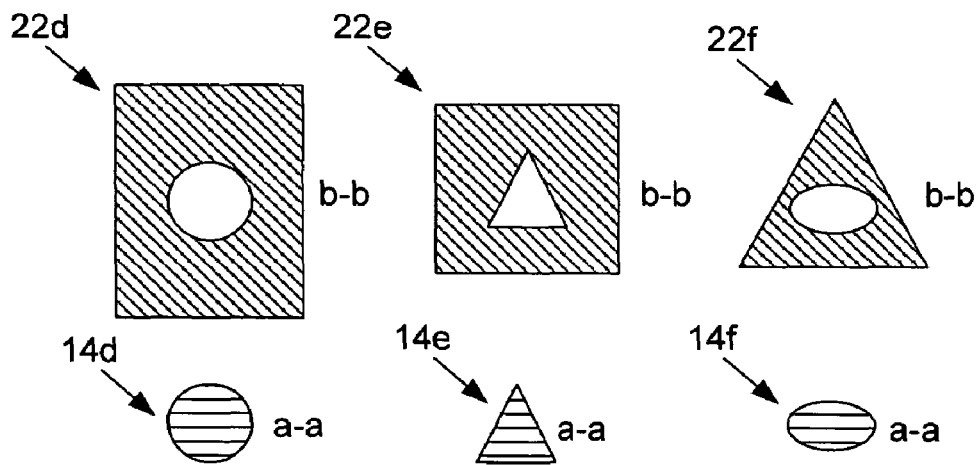
FIG. 2D  FIG. 2E  FIG. 2F

DEVICES HAVING COMPLIANT WAFER-LEVEL INPUT/OUTPUT INTERCONNECTIONS AND PACKAGES USING PILLARS AND METHODS OF FABRICATION THEREOF

CROSS-REFERENCE TO RELATED APPLICATION

This application is a Divisional of application Ser. No.: 10/430,670 filed on May 5, 2003, entitled "Devices Having Compliant Wafer-Level Input/Output Interconnections And Packages Using Pillars And Methods Of Fabrication Thereof, which is entirely incorporated herein by reference. This application claims priority to U.S. provisional application entitled, "METHODS OF INTERCONNECTING CHIP-TO-MODULE ELECTRICAL, OPTICAL, AND RF INPUT/OUTPUT INTERCONNECTS USING MICROCONNECTORS AND PILLARS," having Ser. No. 60/377,416, filed on May 3, 2002, which is entirely incorporated herein by reference. This application is related to co-pending U.S. nonprovisional application entitled, "A WAFER-LEVEL PACKAGE UTILIZING PILLARS OF VARIABLE MATERIALS TO ENABLE THREE-DIMENSIONAL (X-Y-Z) COMPLIANT LEADS," having Ser. No. 60/335,808, filed Oct. 31, 2001, which is entirely incorporated herein by reference.

STATEMENT REGARDING FEDERALLY SPONSORED RESEARCH OR DEVELOPMENT

The U.S. government may have a paid-up license in this invention and the right in limited circumstances to require the patent owner to license others on reasonable terms as provided for by the terms of MDA972-99-1-0002 awarded by the DARPA.

TECHNICAL FIELD

The present invention is generally related to integrated circuits, optoelectronics, photonics, waveguides, optical waveguides and, more particularly, is related to devices having compliant wafer-level input/output interconnections and packaging and methods of fabrication thereof.

BACKGROUND OF THE INVENTION

Conventional chip manufacturing is divided into front-end, back-end, and tail-end processing. Front-end of the line (FEOL) processing refers to the fabrication of transistors, while back-end of the line (BEOL) processing describes wafer metallization. Tail-end of the line (TEOL) processing refers to the packaging of the individual dice. Generally, the final wafer-level process step is the fabrication of vias through a passivation layer to expose the die pads, which serve as the interface between the die and the package. Each individual die, while still part of the wafer, is then functionally tested to identify known good die (KGD) followed by wafer singulation. The KGDs are then shipped to a packaging foundry where they are individually placed in a temporary package for burn-in. The dice that pass this test are then individually packaged into their final package and tested again for functionality. This final step concludes tail-end processing and the functional packaged dice are finally ready for system assembly.

The mechanical performance of a package is important for wafer-level testing, protection, and reliability. Wafer-level testing of electrical devices requires simultaneous reliable electrical contact across a surface area. Typically, neither the wafer nor the testing substrate is planar enough to enable this reliable temporary electrical contact. In-plane (i.e., x-y axis) compliance is generally required to account for potential problems such as, for example, thermal expansion mismatch between the chip and printed wiring board and probe contact with leads. Wafer-level testing and burn-in demand significant out-of-plane (i.e., z-axis) compliance in order to establish reliable electrical contact between the pads on the non-planar wafer and pads/probes on the board surfaces. Non-compliance of the input/output (I/O) interconnects/pads out-of-plane, as well as in-plane (i.e., x-y axis), can cause difficulties in performing wafer-level testing. For optical interconnection, the alignment between the chip and the board should be maintained during field service to minimize optical losses due to offset.

A key interconnection level that will be severely challenged by gigascale integration (GSI) is the chip-to-module interconnection that integrates the packaged chip into the system. A gigascale system-on-a-chip (SoC) demands the development of new and cost effective integrated input/output (I/O) interconnect solutions that use high-performance integrated electrical, optical, and radio frequency (RF) approaches to meet all of the I/O requirements of the 45 to 22 nm International Technology Roadmap for Semiconductors (ITRS) technology nodes (International Technology Roadmap for Semiconductors (ITRS), 2002 update, SIA). Meeting these challenges is essential for the semiconductor industry to transcend known limits on interconnects that would otherwise decelerate or halt the historical rate of progress toward GSI and beyond. In general, power, clock, and signal I/O functions will be met by the selective integration of fine pitch electrical (<30 μm pitch area array), optical, and RF I/O interconnect technologies. These high-density integrated I/O interconnects will be especially important for novel 3D structures as well as for high current (>400 A) and high bandwidth (>40 Tbs) applications. To investigate the above issues, focus should be given to overcoming long-range and fundamental barriers in chip-to-module interconnects by advancing fine-pitch compliant interconnections, optoelectronic and RF interconnections, and wafer-level testing and burn-in.

Accordingly, there is a need in the industry to address the aforementioned deficiencies and/or inadequacies.

SUMMARY OF THE INVENTION

Embodiments of the present invention include devices having one or more of the following: an input/output (I/O) interconnect system, an optical I/O interconnect, an electrical I/O interconnect, and a radio frequency (RF) I/O interconnect. A representative I/O interconnect system includes a first substrate and a second substrate. The first substrate includes a compliant pillar vertically extending from the first substrate. The compliant pillar is constructed of a first material. The second substrate includes a compliant socket adapted to receive the compliant pillar. The compliant socket is constructed of a second material.

The present invention also provides methods for fabricating such devices. A representative method, among others, can be summarized by the following steps: providing a first substrate having a compliant pillar; providing a second substrate having a compliant socket, wherein the compliant socket is adapted to receive a portion of the compliant pillar; and causing the compliant socket to receive a portion of the compliant pillar.

In addition, the present invention provides for a method of directing optical energy. The method can be broadly conceptualized as follows: providing a first substrate having a compliant pillar waveguide that is perpendicular to the first substrate; providing a second substrate disposed parallel to the first substrate; and communicating optical energy through the compliant pillar waveguide to and from the second substrate. The use of mirrors and diffractive grating couplers mitigate surface-normal (right-angle) bends.

Further, the present invention provides for a method of fabricating a device having a compliant pillar. The method includes providing a substrate; disposing a material onto at least one portion of the substrate; and removing portions of the material to form at least one compliant pillar on the substrate.

Further, the present invention provides for a method of fabricating a device having a compliant socket. The method includes providing a substrate; disposing a material onto at least one portion of the substrate; and removing portions of the material to form at least one compliant socket on the substrate.

Other systems, methods, features, and advantages of the present invention will be, or become, apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 1A illustrates a cross-sectional view of a representative embodiment of an input/output (I/O) interconnection system, while FIG. 1B illustrates cross-sectional views of the compliant pillar (cross section a-a of FIG. 1A) and the compliant socket (cross section b-b of FIG. 1A).

FIGS. 2A through 2F are lateral cross-sectional views of the compliant pillar and compliant socket having a plurality of exemplar cross sections.

FIG. 5A illustrates a cross-sectional view of a representative embodiment of an optical I/O interconnection system, while FIG. 5B illustrates cross-sectional views of the optical I/O interconnection (cross section a-a of FIG. 5A) and the compliant socket (cross section b-b of FIG. 5A).

FIG. 8A illustrates a cross-sectional view of a representative embodiment of a RF I/O interconnection system, while FIG. 8B illustrates cross-sectional views of the RF I/O interconnection (cross section a-a of FIG. 8A) and the compliant socket (cross section b-b of FIG. 8A).

FIG. 11A illustrates a cross-sectional view of a representative embodiment of an electrical I/O interconnection system, while FIG. 11B illustrates cross-sectional views of the electrical I/O interconnection (cross section a-a of FIG. 11A) and the compliant socket (cross section b-b of FIG. 11A).

FIG. 14A illustrates the first substrate and the second substrate spaced apart.

DETAILED DESCRIPTION

Figure 3A:
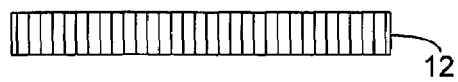
FIGS. 3A through 3E are cross-sectional views that illustrate a representative process for fabricating the compliant pillar illustrated in FIGS. 1A and 1B.

Devices having one or more of the following pairs of component sets: a compliant pillar and a corresponding compliant socket, an optical I/O interconnect and a corresponding compliant socket, a radio frequency (RF) I/O interconnect and a corresponding compliant socket, and an electrical I/O interconnect and a corresponding compliant socket, are described herein. In addition, methods of making these components and methods of using these components are disclosed herein.

The compliant pillar, the optical I/O interconnect, the RF I/O interconnect, and the electrical I/O interconnect can be batch fabricated at the wafer level, while each component's corresponding compliant socket is located on a printed wiring/waveguide board or module.

The types of devices that can use the compliant pillar, the optical I/O interconnect, the RF I/O interconnect, the electrical I/O interconnect, and their corresponding compliant sockets include, but are not limited to, high speed and high performance chips such as, but not limited to, microprocessors, communication chips, and optoeletronic chips.

The component sets include a material to enhance compliance in-plane and out-of-plane (i.e., x-y axis and z axis directions, respectively). The fabrication of the component sets with this material allows the component sets to be compliant in the x-y-z directions, which allows the component sets to be attached to a chip and/or printed board with a higher coefficient of thermal expansion without underfill, thus lowering costs and enhancing reliability.

For optical interconnection, alignment should be maintained between the optical devices on the board and the chip during field service. As a result, it is important to somehow mitigate the offset that may be introduced by thermal expansion mismatches between the chip and the board. This problem can, at least in part, be solved with a mechanically flexible (compliant) optical waveguide pillar that is perpendicular to the chip on which it is disposed. This mitigates optical losses due to offset. In addition, the optical waveguide pillars prevent light spreading as it is routed between two parallel surfaces, such as chip and a board.

In addition, the use of these component sets enables ultra high I/O density (e.g., about 10 to about 100,000 component sets per centimeter squared ($cm^2$)) to be achieved on the chip at wafer-level and printed board, which can enhance power distribution, increase I/O bandwidth, satisfy three-dimensional structural I/O demands, suppress simultaneous switching noise, improve isolation in mixed signal systems, and decrease costs. In addition, wafer-level functionality testing as well as wafer-level burn-in, which can be used to identify known good packaged die (KGPD), can be enhanced (i.e., reduced time and cost). Furthermore, for optical and RF interconnections, high density I/Os enable massive chip to board bandwidth.

Compliant Pillar/Compliant Socket Component Sets

Reference will now be made to the figures. FIG. 1A illustrates a cross-sectional view of a representative embodiment of an input/output (I/O) interconnection system 10. The I/O interconnect system 10 includes a first structure 10a and a second structure 10b. The first structure 10a includes a first substrate 12 and a compliant pillar 14, while the second structure 10b includes a second substrate 20 and a compliant socket 22 adapted to receive the compliant pillar 14. FIG. 1B illustrates cross-sectional views of the compliant pillar 14 (taken along line a-a of FIG. 1A) and the compliant socket 22 (taken along line b-b of FIG. 1A).

The first substrate 12 can include, but is not limited to, electronic and optoelectronic chips. The first substrate 12 can include additional components such as, but not limited to, die pads, leads, input/output components, waveguides (e.g., optical and RF), air gaps, planar waveguides, polymer waveguides, optical waveguides having optical coupling elements such as diffractive grating coupler and mirrors disposed adjacent or within the optical waveguide, photodectors, and optical sources such as VCSELS and LEDs.

The second substrate 20 can include, but is not limited to, a printed wiring board, a printed wiring/waveguide board, and appropriate mating substrates. The second substrate 20 can include additional components such as, but not limited to, die pads, leads, input/output components, waveguides (e.g., optical and RF), air gaps, planar waveguides, polymer waveguides, optical waveguides having optical coupling elements such as diffractive grating coupler and mirrors disposed adjacent or within the optical waveguide, photodectors, and optical sources such as VCSELS and LEDs.

In general, any material that exhibits (a) transparency to a particular optical wavelength of light, (b) process compatibility with other materials such that a contrast in refractive index is achieved, (c) process compatibility with standard microelectronic fabrication processes, (d) suitable mechanical strength, flexibility, and durability, and (e) sufficient lifetime and/or reliability characteristics, can serve as the compliant pillar material. A reference describing polymer materials suitable for optical waveguide applications can be found in A. R. Blythe and J. R. Vinson, *Proc. 5th International Symposium on Polymers for Advanced Technologies.* Tokyo, Japan: pp. 601-11, August-December 2000, which is incorporated herein by reference.

In particular, the compliant pillar 14 and the compliant socket 22 can be made of a low modulus material such as, but not limited to, polyimides, epoxies, polynorbornenes, polyarylene ethers, and parylenes. In particular, the low modulus materials can include, but are not limited to, compounds such as Amoco Ultradel™ 7501, Promerus LLC, Avatrel™ Dielectric Polymer, DuPont™ 2611, DuPont 2734, DuPont 2771, and DuPont 2555. Preferably, the compliant pillar and the compliant socket have been fabricated by photodefinition using the polymer material Avatrel 2000P from Promerus, LLC, or the like, which have shown high optical quality and high compliance.

The compliant pillar 14 depicted in FIGS. 1A and 1B has a lateral circular cross section, while the compliant socket 22 as an inner 24 and an outer 26 lateral circular cross section. The inner lateral cross section 24 defines the area that receives the compliant pillar 14. Thus, when the first structure 12 and the second structure 20 are aligned and coupled, the compliant socket 22, in the area defined by the inner lateral cross section 24, receives a portion of the compliant pillar 14. It should be noted that the compliant pillar 14 and compliant socket 22 assist, in part, in aligning the first substrate 12 and second substrate 20. In order to make a permanent mechanical interconnection, a compatible material, such as polymers and epoxies, can be deposited within the sockets 22 to hold the pillars 14 in place.

The compliant pillar 14 is flexible in the x-y-z directions. In particular, the compliant pillar 14 exhibits greater flexibility and compliance in the x-y axis compared to the z-axis.

The lateral cross sections of the compliant pillar 14 and the compliant socket 22 are not limited to the lateral circular cross section shown in FIGS. 1A and 1B. For example, FIGS. 2A through 2F are lateral cross-sectional views of the compliant pillar 14a . . . 14f and compliant socket 22a . . . 22f having a plurality of exemplar cross sections. It should be noted that the lateral cross-sectional shape of the compliant pillar 14 and the lateral cross-sectional shape of the socket 22 do not have to be the same. For example, the lateral cross-sectional shape of the compliant pillar in FIG. 2A is substantially hexagonal, while the lateral cross-sectional shape of the outer portion of the compliant socket is substantially circular. Also, note that the lateral inner cross-sectional shape of the compliant socket is substantially the same as the lateral cross-sectional shape of the compliant pillar. In general, the compliant socket should be slightly larger to allow easy entry of the compliant pillar into the inner opening. In addition, the inner sidewalls of the sockets may be slanted with a positive slope to enhance pillar to board alignment.

In addition, the compliant pillar 14 can have a lateral cross section such as, but not limited to, a polygonal cross section, a circular cross section, and an elliptical cross section. The compliant socket 22 can have an inner lateral cross section such as, but not limited to, a polygonal cross section, a circular cross section, and an elliptical cross section. Likewise, the outer lateral cross section of the compliant socket 22 can have a cross section such as, but not limited to, a polygonal cross section, a circular cross section, and an elliptical cross section.

The compliant pillar 14 can have a height from about 5 to about 300 micrometers, a width of about 2 to about 150 micrometers, and a length of about 2 to about 150 micrometers. Preferably, the compliant pillar 14 can have a height from about 15 to about 150 micrometers, a width of about 5 to about 50 micrometers, and a length of about 5 to about 50 micrometers.

The type, size, and shape of the compliant pillar 14 and compliant socket 22 determine the compliancy of the compliant pillar 14 and the compliant socket 22. Therefore, selecting the type, size, and shape of the compliant pillar 14 and compliant socket 22 can, in part, control the amount of compliance.

The compliance of the polymer pillars is a function of the cure temperature (e.g., such as 180 to 200° C.) and time duration (e.g., such as 1 to 4 hours) of the cure temperature. For example, the cure temperature for Avatrel 2000P is from about 180 to 200° C. for a time duration of about 1 to 4 hours. Other polymers may have cure temperatures and time durations outside of the above stated range, but one skilled in the art can adjust experimental conditions as needed. The polymer pillar has a lateral compliance in the range of about 2 to 20 micrometers per milli-Newton. For example, compliant pillars about 100 micrometers tall and having a radius of about 55 micrometers wide yielded compliance in the range from 2.5 to 5 micrometers per milli-Newton. The compliant pillar yielded this range of values because of the cure conditions the pillars were subjected to after fabrication. Therefore, the value of compliance can be controlled by the cure conditions. In general, typical cure conditions are for forming 'stiff' compliant pillars can be fabricated under high cure temperature over long cure time conditions, while 'soft' compliant pillars can be fabricated under low cure temperature over short (or none) cure time conditions.

In general, taller pillars yielded higher compliance. However, it should be verified that the compliant pillars are not too 'soft' in the vertical direction. This will ensure that the pillars do not 'crumble' during assembly or processing.

For the purposes of illustration only, and without limitation, embodiments of the present invention will be described with particular reference to the below-described fabrication methods. Note that not every step in the process is described with reference to the process described in the figures hereinafter. Therefore, the following fabrication processes are not intended to be an exhaustive list that includes every step required to fabricate the embodiments of the I/O interconnect system 10.

Figure 3B:
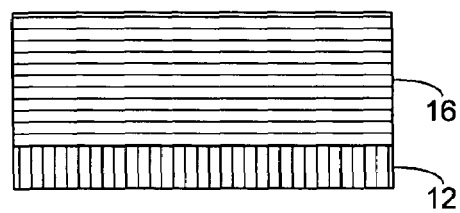

FIGS. 3A through 3E are cross-sectional views that illustrate a representative process for fabricating the compliant pillar 14 illustrated in FIGS. 1A and 1B. FIG. 3A illustrates the substrate 12, while FIG. 3B illustrates a material layer 16 disposed upon the substrate 12. The material layer 16 can be deposited on the substrate 12 by methods such as, for example, spin-coating, doctor-blading, and plasma deposition.

Figure 3C:
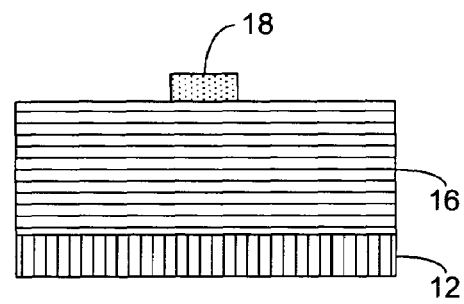

FIG. 3C illustrates the addition of the hard mask 18 disposed upon the material layer 16. The hard mask 18 can be made of a mask material such as, but not limited to, any material that is selective to polymer etching, such as metals and silicone dioxide, for example. Alternatively, no hard mask is necessary when the compliant pillar is photodefined.

Figure 3D:
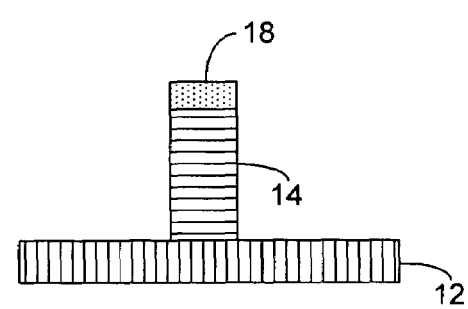
Figure 3E:
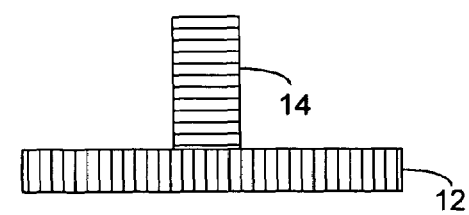

FIG. 3D illustrates the etching of the material layer 16, which forms the compliant pillar 14. The material layer 16 can also be formed using techniques such as, for example, reactive ion etching (RIE), wet etch, and laser drilling. FIG. 3E illustrates the removal of the mask 18.

If the material layer 16 is photosensitive, the compliant pillar can be fabricated by exposing the material 16 in FIG. 3B through a mask to a light source with an appropriate wavelength. The mask contains the cross-sectional geometry of the compliant pillars. After exposure, the exposed material layer 16 may need a hard bake before developing. During developing, a wet chemical agent can be used to remove the non-exposed portions (for negative tone films) of the material to leave behind the compliant pillars (or sockets). As a result, no hard mask is needed for the fabrication processes.

Figure 4A:
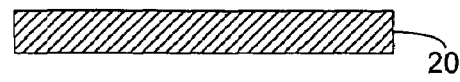
FIGS. 4A through 4E are cross-sectional views that illustrate a representative process for fabricating the compliant socket illustrated in FIGS. 1A and 1B.
Figure 4B:
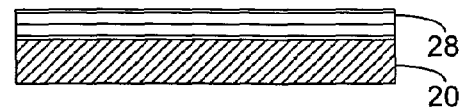

FIGS. 4A through 4E are cross-sectional views that illustrate a representative process for fabricating the compliant socket 22 illustrated in FIGS. 1A and 1B. FIG. 4A illustrates the substrate 20, while FIG. 4B illustrates a material layer 28 disposed upon the substrate 20. The material layer 28 can be deposited on the substrate 20 by methods such as, for example, spin-coating, doctor-blading, and plasma deposition.

Figure 4C:
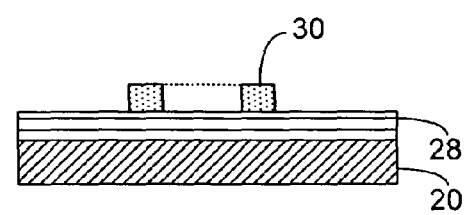

FIG. 4C illustrates the addition of the hard mask 30 disposed upon the material layer 28. The hard mask 30 can be made of materials like those discussed above in reference to FIGS. 3A through 3D. Alternatively, no hard mask 30 is necessary when the compliant socket 22 is photodefined.

Figure 4D:
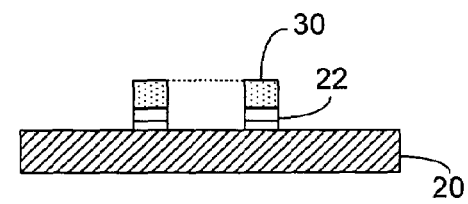
Figure 4E:
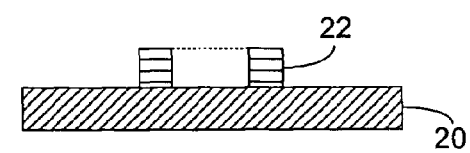

FIG. 4D illustrates the etching of the material layer 28, which forms the compliant socket 22. The material layer 28 can also be formed using techniques such as, for example, reactive ion etching (RIE), photo-definition, molding, and laser drilling. FIG. 4E illustrates the removal of the hard mask 30 and the compliant socket 22, which is adapted to receive at least a portion of the compliant pillar 14.

Fabrication steps similar to that described above in reference to FIGS. 3A through 3E can be used if the material layer 28 is photosensitive.

Optical I/O Interconnect Component Sets

Figures 5A, 5B:
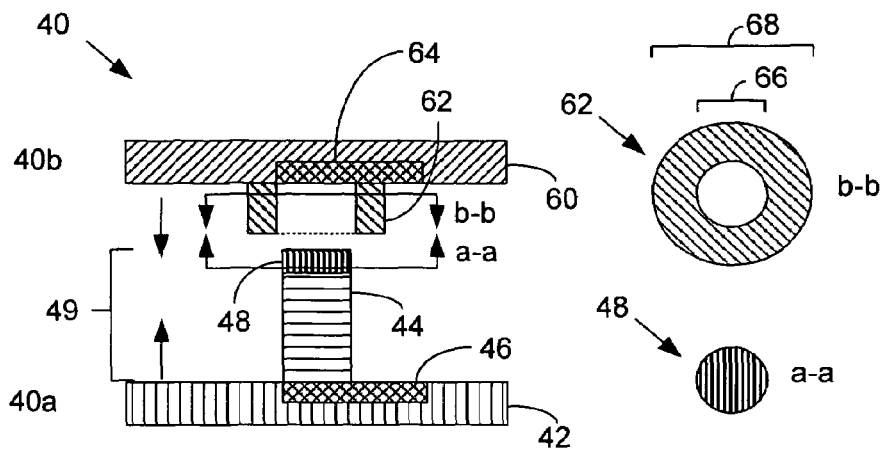

FIG. 5A illustrates a cross-sectional view of a representative embodiment of an optical I/O interconnection system 40. The optical I/O interconnect system 40 includes a first structure 40a and a second structure 40b. The first structure 40a includes a first substrate 42 having a compliant pillar waveguide 44 (e.g., a vertical waveguide perpendicular to the first substrate 42) and an element 48 (e.g., a coupling element such as diffractive grating coupler or a mirror) disposed thereon, while the second structure 40b includes a second substrate 60 having a compliant socket 62 disposed thereon. The compliant pillar waveguide 44 and the element 48 form an optical I/O interconnect 49. The compliant socket 62 is adapted to receive a portion of the optical I/O interconnect 49. FIG. 5B illustrates cross-sectional views of the optical I/O interconnect (cross section a-a of FIG. 5A) and the compliant socket 62 (cross section b-b of FIG. 5A). To make a permanent mechanical interconnection, an optically compatible material such as a polymer or an epoxy can be deposited (not shown) in the socket to mechanically hold the pillars into the sockets.

Each compliant pillar waveguide 44 acts as a waveguide core with the air surrounding it acting as the waveguide cladding. In order to facilitate optical coupling between the compliant pillar waveguides and the board-level optical planar waveguides, coupling elements may be fabricated either on the compliant pillar waveguides 44 or on the board-level waveguides 64. Air can be used as the waveguide cladding because no underfill is required for the compliant pillar waveguides 44 since they are laterally compliant. This enables them to compensate for the different thermo-mechanical expansions between the chip and the board. Thus, compliant optical I/O interconnections mitigate the offsets introduced due to expansion mismatches and nonplanarity.

The air cladding and the resulting high index of refraction difference ($\Delta n$) between the core and the cladding has the benefit of confining the optical wave and thus minimizing crosstalk. Air cladding also has two additional benefits when compared to non-air cladding in this application: 1) the compliant pillar waveguide can guide an optical wave through larger bends (due to large $\Delta n$), which means higher compliance, and 2) the air cladding does not impose any mechanical/physical constraints on the movement of the highly compliant pillar waveguides. Thus, air waveguide cladding offers the lowest index of refraction possible and is the least mechanically resistant material. However, the compliant pillar waveguides may be passivated with any cladding material, if desired.

The first substrate 42 includes, but is not limited to, a chip, high speed and high performance chips such as microprocessors and communication chips, and optoeletronic chips. In addition, the first substrate 42 includes a first waveguide 46 that is positioned perpendicular to the optical I/O interconnect 49, such that they are communicatively coupled. The first substrate 42 can include additional components such as, but not limited to, die pads, leads, input/output components, waveguides, planar waveguides, polymer waveguides, optical waveguides having coupling elements such as diffractive grating couplers or mirrors disposed adjacent or within the optical waveguide, photodetectors, and optical sources such as VCSELS and LEDs.

The second substrate 60 can include, but is not limited to, a printed wiring board, a printed wiring/waveguide board, and ceramic and non-organic substrates and modules. The second substrate 60 includes a second waveguide 64 that is positioned perpendicular to the optical I/O interconnect 49, such that they are communicatively coupled. However, the compliant pillar waveguide can be fabricated directly on an optical source, such as a VECSEL or LED, and phototectors where the area of the active region of the devices is relatively close to that of the compliant pillar waveguide's cross-section. The second substrate 60 can include additional components such as, but not limited to, die pads, leads, input/output components, waveguides, planar waveguides, polymer waveguides, optical waveguides having coupling elements such as diffractive grating couplers or mirrors disposed adjacent or within the optical waveguide, photodectors, and optical sources such as VCSELS and LEDs. The compliant pillars 44 and the optical I/O interconnection 49 can be fabricated directly above optical sources and photodectors as well as optical waveguides with the coupling elements described above.

In general, any material that exhibits: (a) transparency to a particular optical wavelength of light, (b) process compatibility with other materials such that a contrast in refractive index is achieved, (c) process compatibility with standard microelectronic fabrication processes, (d) suitable mechanical strength, flexibility, and durability, and (e) sufficient lifetime and/or reliability characteristics, can serve as the compliant pillar waveguide material. A reference describing polymer materials suitable for optical waveguide applications can be found in A. R. Blythe and J. R. Vinson, *Proc. 5th International Symposium on Polymers for Advanced Technologies.* Tokyo, Japan: pp. 601-11, August-December 2000, which is incorporated herein by reference.

In particular, the compliant pillar waveguide 44 and the compliant socket 62 can be made of a low modulus material such as, but not limited to, polyimides, epoxides, polynorbornenes, polyarylene ethers, and parylenes. In particular, the low modulus materials can include, but is not limited to, compounds such as Amoco Ultradel™ 7501, Promerus™ LLC, Avatrel™ Dielectric Polymer, DuPont™ 2611, DuPont™ 2734, DuPont™ 2771, and DuPont™ 2555.

The compliant pillar waveguide 44 depicted in FIGS. 5A and 5B has a lateral circular cross section, while the compliant socket 62 as an inner 66 and an outer 68 lateral circular cross section. The inner lateral cross section 66 defines the area that receives the optical I/O interconnect 49. Thus, when the first structure 42 and the second structure 60 are aligned and coupled, the compliant socket 62, in the area defined by the inner lateral cross section 66, receives a portion of the optical I/O interconnect 49. However, any cross section can be used.

The compliant pillar waveguide 44 is flexible in the x-y-z directions and therefore, no underfill is needed. In addition, the compliant pillar waveguide 44 is capable of having very high optical coupling efficiency when optical energy (e.g., light) passes from the first substrate 42 to the second substrate 60 through the compliant pillar waveguide 44.

The lateral cross sections of the compliant pillar waveguide 44 and the compliant socket 62 are not limited to the lateral circular cross section shown in FIGS. 5A and 5B, but they can include the cross sections discussed in reference to FIGS. 2A and 2F and the corresponding text.

The compliant pillar waveguide 44 can have a height from about 5 to about 300 micrometers, a width of about 2 to about 150 micrometers, and a length of about 2 to about 150 micrometers. Preferably, the compliant pillar waveguide 44 can have a height from about 15 to about 150 micrometers, a width of about 5 to about 50 micrometers, and a length of about 5 to about 50 micrometers.

The compliant socket 62 can have a height from about 5 to 30 micrometers and a width of about 1.1 to 4 times larger than the compliant pillar waveguide cross-section.

The type, size, and shape of the compliant pillar waveguide 44 and compliant socket 62 determine the compliancy of the compliant pillar waveguide and the compliant socket 62. Therefore, selecting the type, size, and shape of the compliant pillar waveguide 44 and compliant socket 62 can, in part, control the amount of compliance. Moreover, the shape of the compliant pillar waveguide 44 and the aspect ratio determines the optical transmission characteristics of the compliant pillar waveguide 44.

The compliant pillar waveguide 44 functions as a medium for optical energy to travel through. Therefore, the compliant pillar waveguide 44 can communicate optical energy from the first waveguide 46 in the first structure 42 to the second waveguide 64 in the second structure 60.

The optical energy traveling through the compliant pillar waveguide 44 can be directed into and out of the compliant pillar waveguide 44 through the element 48. For example, the element 48 is disposed at the end of the compliant pillar waveguide 44 opposite the first substrate 42. In addition, the element 48 may be disposed adjacent or within the first waveguide 46 and/or second waveguide 64 to channel the optical energy out of or into the compliant pillar waveguide 44 (not shown). In this manner, optical energy can enter the compliant pillar waveguide 44 via the first waveguide 46, travel through the compliant pillar waveguide 44, exit the element 48 disposed at the end of the compliant pillar waveguide 44, and enter the second waveguide 64. The position of the planar optical waveguide 64 relative to the compliant pillar waveguide (i.e., whether it is terminated below or adjacent to the pillar) is a function of the location and type of element used.

If the optical waveguide 64 is terminated with a mirror (as demonstrated in R. Chen, et al., "Fully embedded board-level guided-wave optoelectronic interconnects," *Proc. IEEE,* Vol. 88, pp.780-793, June 2000) or a diffractive grating coupler (as demonstrated in S. Schultz, et al., "Design, fabrication, and performance of preferential-order volume grating waveguide couplers," *Appl. Opt.,* vol. 39, pp. 1223-1232, March 2000), then the compliant pillar 44 without the coupling element 48 would be placed above that terminated region of the planar waveguide 64.

If the diffractive grating coupler were to be fabricated on the compliant pillar waveguide 44 this yields the optical interconnect 49 described previously. In this case, the optical interconnect 49 can be placed either adjacent to or on the tip of the planar optical waveguide 64. It should be noted that there is freedom with respect to the choice of the optical element to be used to mitigate the surface-normal (right-angle) bends and to its location (on the pillar 44 or planar waveguide 64). Moreover, the index of refraction of the socket material should be lower than that of the compliant pillar waveguide.

The presence of the element 48, however, is not a requirement for some embodiments of the present invention, as simple butt-coupling of optical power both into and/or out of compliant pillar waveguide 44 can also be performed.

The first waveguide 46 and second waveguide 64 can be defined through multiple fabrication processes such as, but not limited to, photo-definition, wet chemical etching, dry plasma etching, thermally-induced refractive index gradients, and ion implantation. In addition, the first waveguide 46 and second waveguide 64 can have geometries such as, for example, raised strip geometry, buried geometry, and rib geometry.

The element 48 can include mirrors, planar (or volume) grating couplers, evanescent couplers, surface-relief grating couplers, and total internal reflection couplers, for example. More specifically, when the element 48 is a volume grating coupler, the coupling material can be laminated or spin-coated onto the appropriate surface. In particular, a laminated volume grating coupler can be formed by holographic exposure of the grating region following lamination of the grating material. Alternatively, the laminated volume grating coupler can be formed by holographic exposure prior to lamination of the grating material. In the case where the coupling element 48 is to be formed inside of the compliant pillar waveguide, the compliant pillar waveguide and coupler can be composed of separate materials. Additional details regarding grating couplers can be found in U.S. Pat. No. 6,285,813, which is herein incorporated by reference.

If the element 48 is a grating coupler, then the grating coupler material includes materials such as, for example, polymer materials, silver halide photographic emulsions, photoresists such as dichromated gelatin, photopolymers such as polymethyl methacrylate (PMMA) or Dupont™ HRF photopolymer films, for example, thermoplastic materials, photochromic materials such as crystals, glasses or organic substrates, photodichroic materials, and photorefractive crystals such as lithium niobate, for example. These materials have the characteristics of creating a refractive index modulation through a variety of mechanisms, all of which result in the creation of a phase or absorption or mixed grating. Other suitable materials are described in T. K. Gaylord and M. G. Moharam, *Proc. IEEE*, vol. 73, pp. 894-937, May 1985, which is herein incorporated by reference. The fabrication of a grating coupler is preferred to be done on the compliant pillar waveguide, and thus at the wafer-level, where nanolithography is readily available. To fabricate such a device on the printed wiring/waveguide board would potentially be expensive.

An additional feature of the compliant pillar waveguide 44 is that portions of the compliant pillar waveguide 44 not bound by the compliant socket 62 are surrounded by air, which acts as an air-gap cladding layer. The advantages of the air-cladding in this application were described above. It should be pointed out that some of the material requirements for conventional optical interconnects do not necessarily apply to the compliant pillar waveguides. For example, the materials are not restricted to ultra-low absorption optical materials due to the short height (below 300 micrometers) of the compliant pillar waveguides.

For the purposes of illustration only, and without limitation, embodiments of the present invention will be described with particular reference to the below-described fabrication methods. Note that not every step in the process is described with reference to the process described in the figures hereinafter. Therefore, the following fabrication processes are not intended to be an exhaustive list that includes every step required to fabricate the embodiments of the optical I/O interconnect system 40.

Figure 6A:
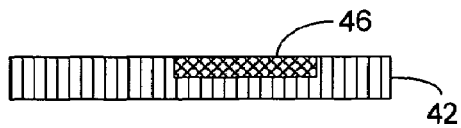
FIGS. 6A through 6F are cross-sectional views that illustrate a representative process for fabricating the optical I/O system illustrated in FIGS. 5A and 5B.
Figure 6B:
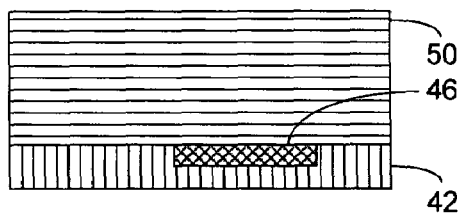
Figure 6E:
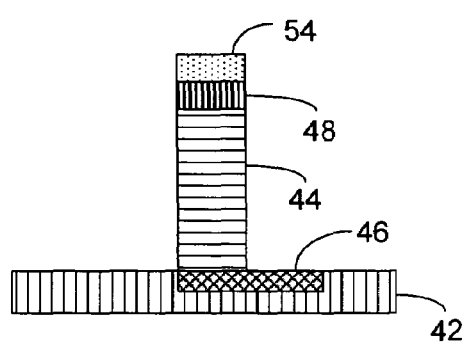
Figure 6C:
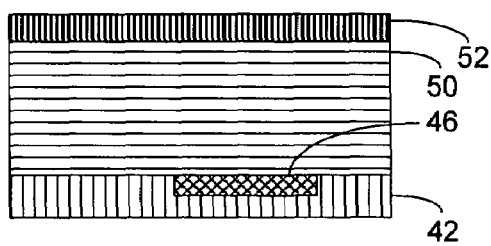

FIGS. 6A through 6F are cross-sectional views that illustrate a representative process for fabricating the optical I/O system 49 illustrated in FIGS. 5A and 5B. FIG. 6A illustrates the substrate 42 that includes the first waveguide 46, while FIG. 6B illustrates a material layer 50 disposed upon the substrate 42. An optical photodetector or source, such as VECSEL of LED, can be fabricated directly below the pillar without the planar waveguide shown in the FIG. 6A. FIG. 6C illustrates a coupling material 52 disposed on top of the material layer 50. The material layer 50 and the coupling material 52 can be deposited on the substrate 42 by methods such as, for example, spin-coating, doctor-blading, lamination, and plasma deposition.

Figure 6F:
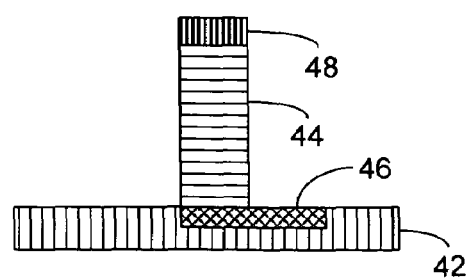
Figure 6D:
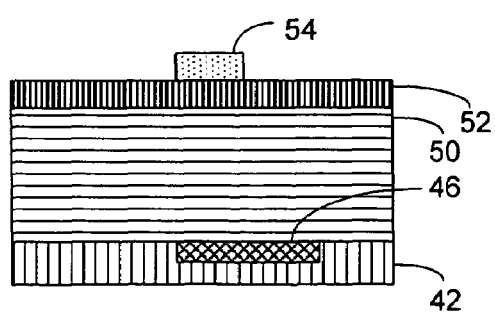

FIG. 6D illustrates the addition of a hard mask 54 disposed upon the coupling material 52. The hard mask 54 can be made of material such as those described above in reference to FIGS. 3A though 3D. Alternatively, no hard mask is necessary when the compliant pillar waveguide 44 is photodefined.

FIG. 6E illustrates the etching of the material layer 50 and the coupling material 52, which forms the optical I/O interconnect 49 (e.g., compliant pillar waveguide 44 and the coupling element 48 or a mirror). The material layer 50 and the coupling material 52 can also be formed using techniques such as, for example, reactive ion etching (RIE), photo-definition, and laser drilling. In addition, the material layer may be altered to form a coupling element. FIG. 6F illustrates the removal of the hard mask 54.

If surface relief gratings are to be fabricated on the pillars, the material layer 50 can be first patterned with the desired surface relief using plasma etching followed by the fabrication of the pillars 44. Alternatively the coupling element 48 can be fabricated after the compliant pillars 44 have been fabricated. The process can be similar to that described above.

Fabrication steps similar to that described above in reference to FIGS. 3A through 3E can be used if the material layer is photosensitive.

Figure 7A:
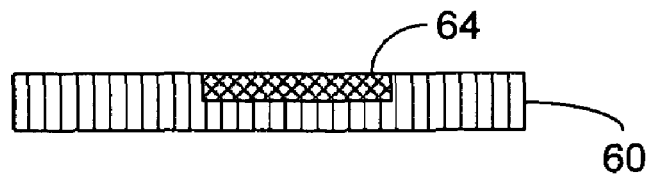
FIGS. 7A through 7E are cross-sectional views that illustrate a representative process for fabricating the compliant socket illustrated in FIGS. 5A and 5B.
Figure 7B:
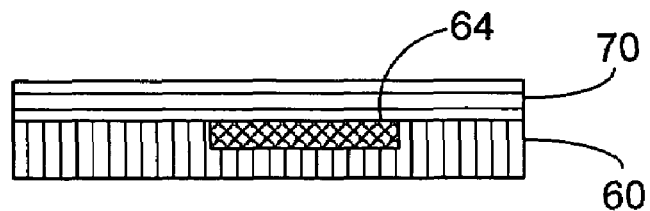

FIGS. 7A through 7E are cross-sectional views that illustrate a representative process for fabricating the compliant socket 62 illustrated in FIGS. 5A and 5B. FIG. 7A illustrates the substrate 60 having a second waveguide 64, while FIG. 7B illustrates a material layer 70 disposed upon the substrate 60. The material layer 70 can be deposited on the substrate 60 by methods such as, for example, spin-coating, doctor-blading, and plasma deposition.

Figure 7C:
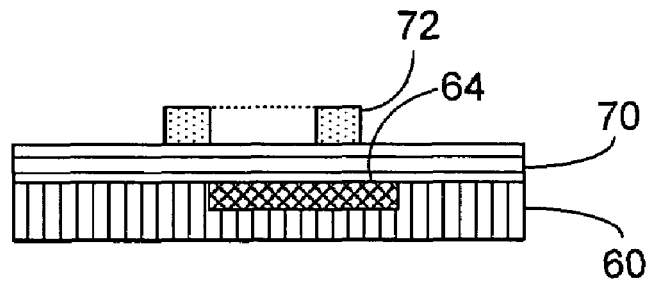

FIG. 7C illustrates the addition of the hard mask 72 disposed upon the material layer 70. The hard mask 72 can be made of material such as those described above in reference to FIGS. 3A through 3D. Alternatively, no hard mask is necessary when the sockets are photodefined.

Figure 7D:
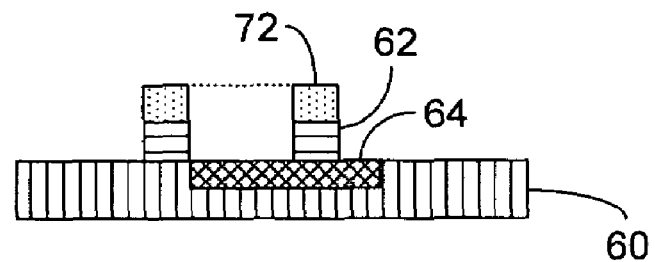
Figure 7E:
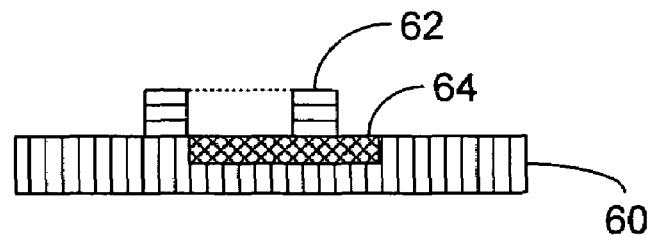

FIG. 7D illustrates the etching of the material layer 70, which forms the compliant socket 62. The material layer 70 can also be formed using techniques such as, for example, reactive ion etching (RIE), photo-definition, and laser drilling. FIG. 7E illustrates the removal of the hard mask 72 and reveals the compliant socket 62, which is adapted to receive at least a portion of the optical I/O interconnect 49.

Fabrication steps similar to that described above in reference to FIGS. 3A through 3E can be used if the material layer is photosensitive.

RF I/O Interconnect Component Sets

Figures 8A, 8B:
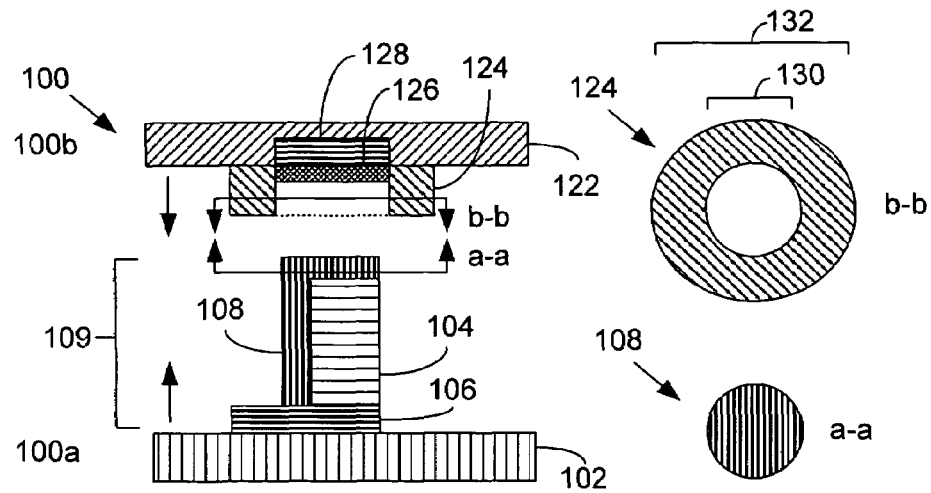

FIG. 8A illustrates a cross-sectional view of a representative embodiment of a RF I/O interconnection system 100. The RF I/O interconnect system 100 includes a first structure 100a and a second structure 100b. The first structure 100a includes a first substrate 102 having a compliant pillar 104, a RF lead 108, and a RF waveguide 106, while the second structure 100b includes a second substrate 122 having a compliant socket 124. The RF lead 108 is disposed on a portion of the RF waveguide 106 and on a portion of the compliant pillar 104.

Figures 11A, 11B:
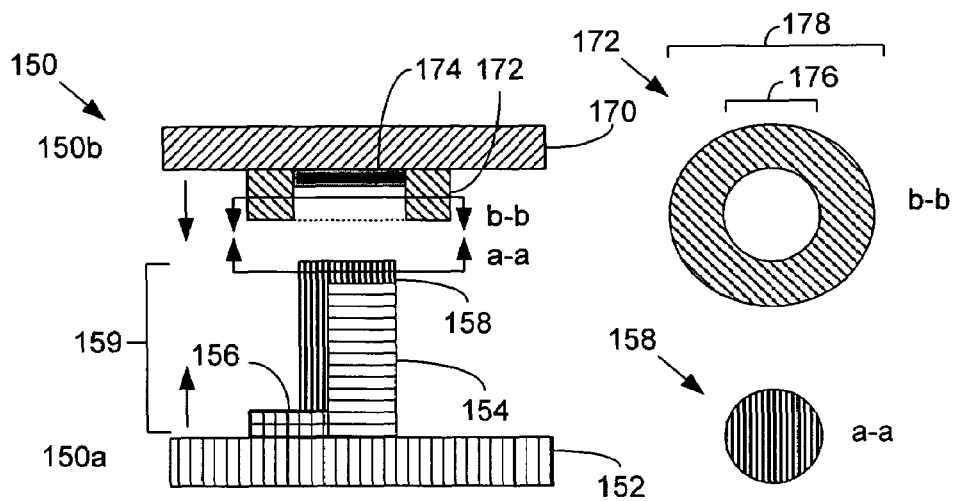

The RF lead 108 and compliant pillar 104 form a RF I/O interconnect 109. The compliant socket 124 includes a dielectric material 126 disposed therein. When the two structures 100a and 100b are brought into contact, the result is a capacitor. The metal on the pillar and the on the pad make the two parallel plates of the capacitor with the high-k material being the dielectric 126. The compliant socket 124 is adapted to receive a portion of the RF I/O interconnect 109. FIG. 11B illustrates cross-sectional views of the RF I/O interconnect 109 (cross section a-a of FIG. 11A) and the compliant socket 124 (cross section b-b of FIG. 11A). For mechanical interconnection, a compatible material, such as polymers and epoxies, is deposited in the socket 62 to mechanically hold the pillar RF I/O interconnect 109 in the socket 62.

The first substrate 102 includes, but is not limited to, chips, high speed and high performance chips such as, but not limited to, microprocessors, communication chips, and opto-eletronic chips. The first substrate 102 can include additional components such as, but not limited to, die pads, leads, input/output components, waveguides, air-gaps, and planar waveguides, polymer waveguides, optical waveguides terminated with diffractive grating couplers or mirrors, photodectors, optical sources such as VCSELS and LEDs.

The second substrate 122 can include, but is not limited to, printed wiring boards, printed wiring/waveguide boards, ceramic and non-organic substrates and modules. The second substrate 122 can include additional components such as, but not limited to, die pads, leads, input/output components, waveguides, air-gaps, planar waveguides, polymer waveguides, optical waveguides terminated with diffractive grating couplers or mirrors, photodectors, and optical sources such as VCSELS and LEDs.

The compliant pillar 104 and the compliant socket 124 can be made of materials similar to those discussed in reference to FIGS. 1A and 1B and FIGS. 5A and 5B. In addition, the size and shape of the compliant pillar 104 and compliant socket 124 are similar to those discussed in reference to FIGS. 1A and 1B and FIGS. 5A and 5B.

The compliant pillar 104 can have a height from about 5 to about 300 micrometers, a width of about 2 to about 150 micrometers, and a length of about 2 to about 150 micrometers. Preferably, the compliant pillar 104 can have a height from about 15 to about 150 micrometers, a width of about 5 to about 50 micrometers, and a length of about 5 to about 50 micrometers.

The compliant socket 124 can have a height from about 5 to 30 micrometers and a width of about 1.1 to 4 times larger than the compliant pillar width (including the RF lead 108).

The compliant pillar 104 is flexible in the x-y-z directions, and therefore, no underfill is needed. However, the overall compliance of the RF interconnect 109 is lower than that of the intrinsic pillar 104. This is due to the metallic RF lead 108 disposed on the compliant pillar 104. The compliance of the compliant pillar 104 tends to decrease with the fabrication of metal on its sidewalls because the metal has a much higher Young's modulus than polymers and tends to plastically deform. The thickness of metal has to be selected such that it yields the desirable electrical characteristics without disturbing the high compliance of the intrinsic polymer pillars.

The type, size, and shape of the compliant pillar 104 and compliant socket 124 determine the compliancy of the compliant pillar 104 and the compliant socket 124. Therefore, selecting the type, size, and shape of the compliant pillar 104 and compliant socket 124 can, in part, control the amount of compliance. The size of the pillar 104 and that RF lead 108 also influence the value of capacitance: the larger the metallic area, the larger the capacitance.

The compliant socket 124 shown in FIGS. 8A and 8B includes a high K dielectric material 126 to increase the capacitance between the two metal plates (pad/waveguide on the board and the metal on the compliant pillar) in the attachment of the RF lead 108 to the compliant socket 124. The high K dielectric material 126 can be a material such as, but not limited to, organic material such as polymers and inorganic materials such as silicon nitride.

The RF waveguide 106 can be deposited upon the surface of the first substrate 102 using techniques such as, for example, sputtering, evaporation, electron-beam deposition, electroplating, electro-less plating, and displacement reactions.

The waveguide on the board or on the chip can take several configurations including microstrip lines and coplanar waveguides. A reference on microwave waveguides is D. Pozar, Microwave Engineering, $2^{nd}$ ed., John Wiley & Sons, 1998. A reference for nearfield capacitive couplers is M. F. Chang, et al., RF/wireless interconnect for inter- and intra-chip communications, Proc. of the IEEE, pp. 456-466, April 2002. The compliant pillar can be incorporated in wireless communication networks as described in the previous paper.

The geometry of the RF lead 108 that can be used in embodiments of the present invention is not limited to that shown in FIGS. 5A and 5B. Instead, various RF lead 108 geometries can provide compliance, consistent with the scope of the present invention. Additional steps can be performed to fabricate an attachment or contact on the end portion of the RF lead 108. This contact (not shown) can include a variety of items designed to contact or attach to a RF pad or point on another RF substrate. These contacts can be, for example, an adhesive, epoxy, and any other material to assist in making a mechanical connection between the two.

The RF lead 108 can be fabricated of one or more layers of metals, metal composites, organic conductors, or combinations thereof, appropriate for the RF I/O interconnection system 100. The metals and metal composites include, but are not limited to, gold, gold alloys, copper, copper alloys, and the like. The RF lead 108 can be fabricated by monolithically electroplating the selected metal or metal composite onto the first substrate 102.

The RF lead 108 can have a thickness that ranges from about 1 to about 100 micrometers, and preferably from about 0.5 to about 10 micrometers. The preferred embodiment of the RF lead 108 has a thickness of about 2 micrometers. The RF lead 108 can have lengths that range from about 2 and about 300 micrometers, and preferably from about 30 to about 150 micrometers. The RF lead 108 can have a width that ranges from about 1 to about 100 micrometers, and preferably from about 2 to about 50 micrometers. The RF lead 108 can have a height that ranges from about 10 to about 300 micrometers, and preferably from about 30 to about 150 micrometers.

For the purposes of illustration only, and without limitation, embodiments of the present invention will be described with particular reference to the below-described fabrication methods. Note that not every step in the process is described with reference to the process described in the figures hereinafter. Therefore, the following fabrication processes are not intended to be an exhaustive list that includes every step required to fabricate the embodiments of the RF I/O interconnect system 100.

Figure 9A:
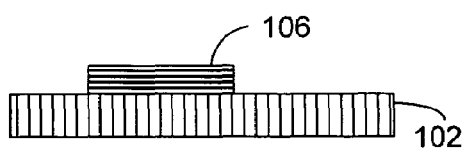
FIGS. 9A through 9F are cross-sectional views that illustrate a representative process for fabricating the RF I/O system illustrated in FIGS. 8A and 8B.
Figure 9D:
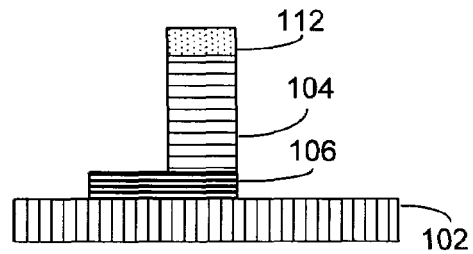
Figure 9B:
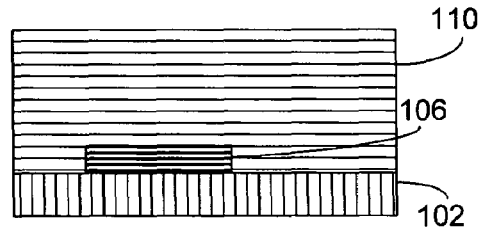

FIGS. 9A through 9F are cross-sectional views that illustrate a representative process for fabricating the RF I/O system 100 illustrated in FIGS. 8A and 8B. FIG. 9A illustrates the substrate 102 showing a portion of an RF waveguide 106 disposed thereon, while FIG. 9B illustrates a material layer 110 disposed upon the substrate 102 and the RF waveguide 106. The material layer 110 can be deposited on the substrate 102 by methods such as, for example, spin-coating, doctor-blading, and plasma deposition.

Figure 9E:
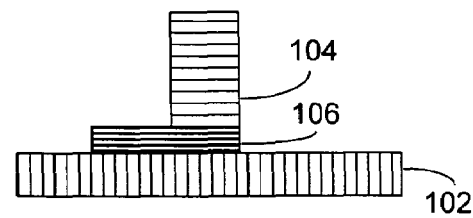
Figure 9C:
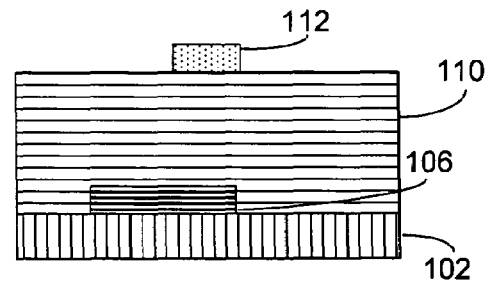

FIG. 9C illustrates the addition of a hard mask 112 disposed upon the material layer 110. The hard mask 112 can be made of materials such as those described above in reference to FIGS. 3A through 3D. Alternatively, no hard mask is necessary when the compliant pillar waveguide is photodefined.

FIG. 9D illustrates the etching of the material layer 110, which forms the compliant pillar 104. The material layer 110 can also be formed using techniques such as, for example, reactive ion etching (RIE), photo-definition, and laser drilling.

Figure 9F:
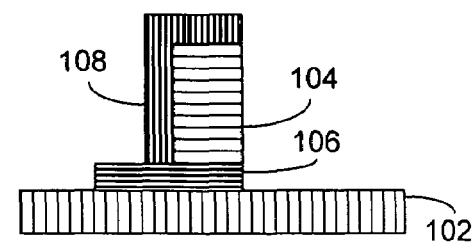

FIG. 9E illustrates the removal of the hard mask 112. FIG. 9F illustrates the formation of a RF lead 108 on a portion of the RF waveguide 106 and the compliant pillar 104. However, the entire surface of the compliant pillar may be metallized.

Fabrication steps similar to that described above in reference to FIGS. 3A through 3E can be used if the material layer is photosensitive.

Figure 10A:
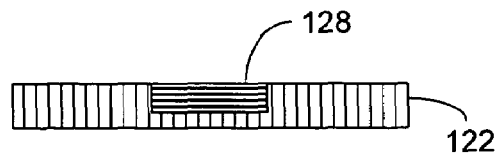
FIGS. 10A through 10F are cross-sectional views that illustrate a representative process for fabricating the compliant socket illustrated in FIGS. 8A and 8B.
Figure 10B:
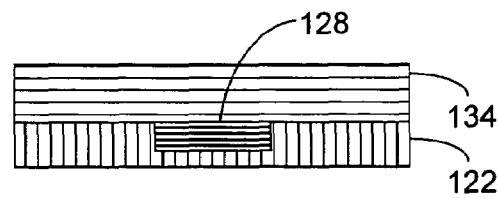

FIGS. 10A through 10F are cross-sectional views that illustrate a representative process for fabricating the compliant socket 124 illustrated in FIGS. 8A and 8B. FIG. 10A illustrates the substrate 122 having a RF waveguide 128, while FIG. 10B illustrates a material layer 134 disposed upon the substrate 122. The material layer 134 can be deposited on the substrate 122 by methods such as, for example, spin-coating, doctor-blading, and plasma deposition.

Figure 10C:
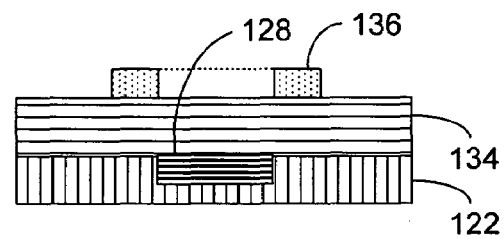

FIG. 10C illustrates the addition of the hard mask 136 disposed upon the material layer 134. The hard mask 136 can be made of material such as those described in reference to FIGS. 3A through 3D. Alternatively, no hard mask is necessary when the compliant sockets are photodefined.

Figure 10D:
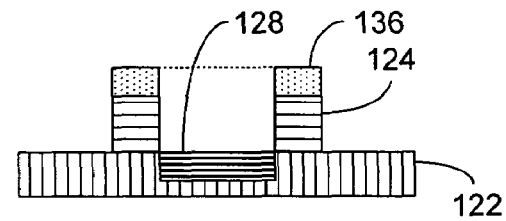
Figure 10E:
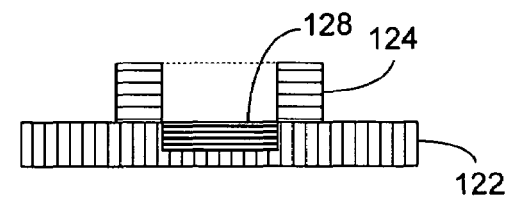

FIG. 10D illustrates the etching of the material layer 134, which forms the compliant socket 124. The material layer 134 can also be formed using techniques such as, for example, reactive ion etching (RIE), photo-definition, and laser drilling. FIG. 10E illustrates the removal of the hard mask 136.

Figure 10F:
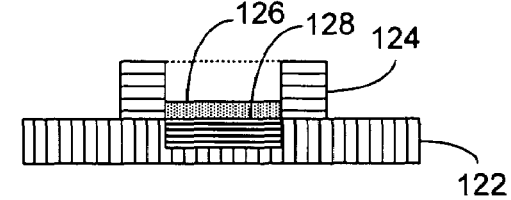

FIG. 10F illustrates disposing a high K dielectric material 126 within the compliant socket. The high K dielectric material 126 can be disposed within the compliant socket 124 using techniques such as, for example, plasma assisted deposition, spin-coating, screen/stencil printing, and doctor-blading. The compliant socket 124 is adapted to receive at least a portion of the RF I/O interconnect 109, which can be bound by the high K dielectric material 126. The high-K material may be fabricated before the application of the material 134 in FIG. 10B. Also, it can be fabricated on the metal on the compliant pillar's tip.

Fabrication steps similar to that described above in reference to FIGS. 3A through 3E can be used if the material layer is photosensitive.

Electrical I/O Interconnect Component Sets

FIG. 11A illustrates a cross-sectional view of a representative embodiment of an electrical I/O interconnection system 150. The electrical I/O interconnect system 150 includes a first structure 150a and a second structure 150b. The first structure 150a includes a first substrate 152 having a compliant pillar 154, a die pad 156, and an electrical lead 158, while the second structure 150b includes a second substrate 170 having a compliant socket 172. The electrical lead 158 is disposed on a portion of the die pad 156 and on a portion or the entire surface of the compliant pillar 154. The electrical lead 158 and compliant pillar 154 form an electrical I/O interconnect 159. The compliant socket 172 includes a solder material 174 disposed therein. The compliant socket 172 is adapted to receive the electrical I/O interconnect 159. FIG. 11B illustrates cross-sectional views of the electrical I/O interconnect 159 (cross section a-a of FIG. 11A) and the compliant socket 172 (cross section b-b of FIG. 11A).

The first substrate 152 includes, but is not limited to, chips, high speed and high performance chips such as, but not limited to, microprocessors, communication chips, and opto-eletronic chips. The first substrate 152 can include additional components such as, but not limited to, die pads, leads, input/output components, waveguides, air-gaps, planar waveguides, polymer waveguides, optical waveguides having coupling elements such as diffractive grating couplers or mirrors, photodectors, and optical source such as VCSELS and LEDs.

The second substrate 170 can include, but is not limited to, printed wiring boards, printed wiring/waveguide boards, ceramic and non-organic substrates and modules. The second substrate 170 can include additional components such as, but not limited to, die pads, leads, input/output components, waveguides, air-gaps, planar waveguides, polymer waveguides, optical waveguides having coupling elements such as diffractive grating couplers or mirrors disposed adjacent or within the optical waveguide, photodetectors, and optical sources such as VCSELS and LEDs.

The compliant pillar 154 and the compliant socket 172 can be made of a material similar to those discussed in reference to FIGS. 1A and 1B. In addition, the size and shape of the compliant pillar 154 and compliant socket 172 are similar to those discussed in reference to FIGS. 1A and 1B.

The compliant pillar 154 can have a height from about 5 to about 300 micrometers, a width of about 2 to about 150 micrometers, and a length of about 2 to about 150 micrometers. Preferably, the compliant pillar 154 can have a height from about 30 to about 150 micrometers, a width of about 5 to about 50 micrometers, and a length of about 5 to about 50 micrometers. The compliant socket 172 can have a height from about 5 to 30 micrometers and a width of about 1.1 to 4 times the width of the compliant pillar.

The compliant pillar 154 is flexible in the x-y-z directions and therefore, no underfill is needed. As with the RF interconnect, the fabrication of the electrical lead 158 disposed on the compliant pillar 154 may be lower than the compliancy of the aggregate structure (the electrical interconnection 159). The compliance of the pillar tends to decrease with the fabrication of metal on its sidewalls because the metal has a much higher Young's modulus than polymers and tends to plastically deform. The thickness of metal has to be selected such that it yields low parasitic electrical interconnection without disturbing the high compliance of the intrinsic polymer pillars.

The type, size, and shape of the compliant pillar 154 and compliant socket 172 determine the compliancy of the compliant pillar 154 and the compliant socket 172. Therefore, selecting the type, size, and shape of the compliant pillar 154 and compliant socket 172 can, in part, control the amount of compliance.

The compliant socket 172 shown in FIGS. 11A and 11B includes a solder material 174 to assist in the attachment of the lead to the compliant socket 172. The solder material 174 can be a material such as, but not limited to, lead and lead free solder such as tin-lead and tin-copper-silver alloy solders. In addition, conductive adhesives can also be used as the solder material.

The die pad 156 is assumed to already exit on the die that the compliant pillars 154 are fabricated on. Otherwise, the pads can be deposited upon the surface of the first substrate 152 using techniques such as, for example, sputtering, evaporation, electron-beam deposition, electroplating, electro-less plating, and displacement reactions.

The geometry of the electrical leads 158 that can be used in embodiments of the present invention is not limited to that shown in FIG. 11A. Instead, various electrical lead 158 geometries can provide compliance consistent with the scope of the present invention. Additional steps can be performed to fabricate an attachment or contact on the end portion of the electrical lead. This contact (not shown) can include a variety of items designed to contact or attach to a pad or point on another substrate. These contacts can be, for example, a solder bump, a conductive adhesive, or a contact probe.

The electrical lead 158 can be fabricated of one or more layers of metals, metal composites, organic conductors, or combinations thereof, appropriate for the electrical I/O interconnection system 150. The metals and metal composites include, but are not limited to, gold, gold alloys, copper, and copper alloys. The electrical lead 158 can be fabricated by monolithically electroplating the selected metal or metal composite onto the first substrate.

The electrical lead 158 can have a thickness that ranges from about 1 to about 100 micrometers, and preferably from about 0.5 to about 10 micrometers. The preferred embodiment of the electrical lead 158 has a thickness of about 2 micrometers. The electrical lead 158 can have lengths that range from about 2 and about 300 micrometers, and preferably from about 30 to about 150 micrometers. The electrical lead 158 can have a width that ranges from about 1 to about 100 micrometers, and preferably from about 2 to about 40 micrometers. The electrical lead 158 can have a height that ranges from about 10 to about 300 micrometers, and preferably from about 30 to about 150 micrometers.

For the purposes of illustration only, and without limitation, embodiments of the present invention will be described with particular reference to the below-described fabrication methods. Note that not every step in the process is described with reference to the process described in the figures hereinafter. Therefore, the following fabrication processes are not intended to be an exhaustive list that includes every step required to fabricate the embodiments of the electrical I/O interconnect system 150.

Figure 12A:
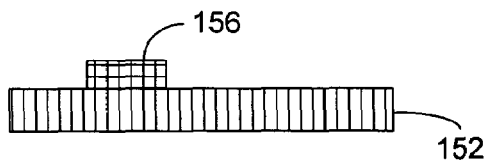
FIGS. 12A through 12F are cross-sectional views that illustrate a representative process for fabricating the compliant pillar illustrated in FIGS. 11A and 11B.
Figure 12D:
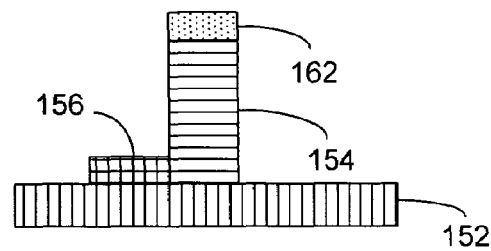
Figure 12B:
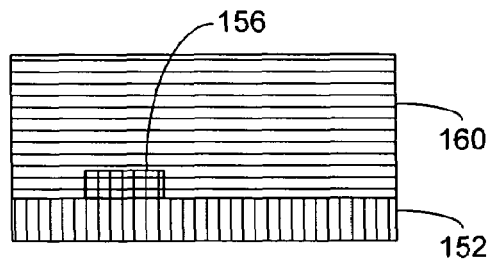

FIGS. 12A through 12F are cross-sectional views that illustrate a representative process for fabricating the electrical I/O system 150 illustrated in FIGS. 11A and 11B. FIG. 12A illustrates the substrate 152 having a die pad 156 disposed thereon, while FIG. 12B illustrates a material layer 160 disposed upon the substrate 152 and the die pad 156. The material layer 160 can be deposited on the substrate 154 by methods such as, for example, spin-coating, doctor-blading, and plasma deposition.

Figure 12E:
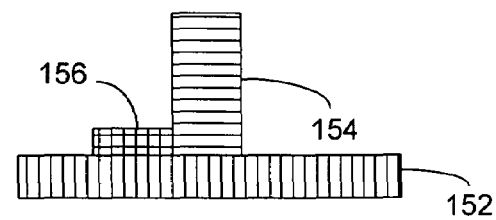
Figure 12C:
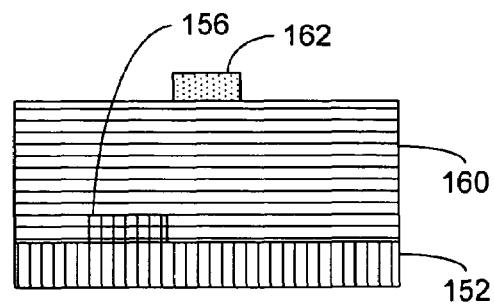

FIG. 12C illustrates the addition of a hard mask 162 disposed upon the material layer 160. The hard mask 162 can be made of materials such as those described in reference to FIGS. 3A through 3D. Alternatively, no hard mask is necessary when the compliant pillar waveguide is photodefined.

FIG. 12D illustrates the etching of the material layer 160, which forms the compliant pillar 154. The material layer 160 can also be formed using techniques such as, for example, reactive ion etching (RIE), photo-definition, and laser drilling.

Figure 12F:
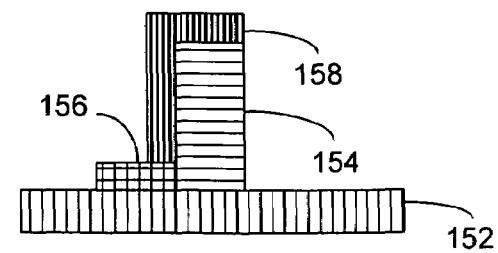

FIG. 12E illustrates the removal of the hard mask 162. FIG. 12F illustrates the formation of the electrical lead 158 on a portion of the die pad 156 and the compliant pillar 154.

Fabrication steps similar to that described above in reference to FIGS. 3A through 3E can be used if the material layer is photosensitive.

Figure 13A:
FIGS. 13A through 13F are cross-sectional views that illustrate a representative process for fabricating the compliant socket illustrated in FIGS. 11A and 11B.
Figure 13B:
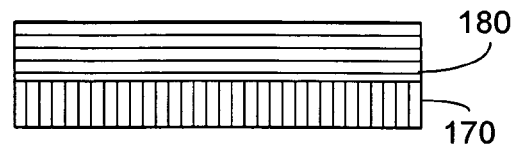

FIGS. 13A through 13F are cross-sectional views that illustrate a representative process for fabricating the compliant socket 172 illustrated in FIGS. 11A and 11B. FIG. 13A illustrates the substrate 170, while FIG. 13B illustrates a material layer 180 disposed upon the substrate 170. The material layer 180 can be deposited on the substrate 170 by methods such as, for example, spin-coating, doctor-blading, and plasma deposition.

Figure 13C:
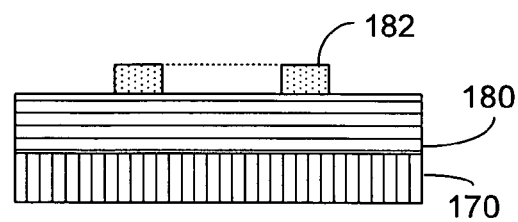

FIG. 13C illustrates the addition of the hard mask 182 disposed upon the material layer 180. The hard mask 182 can be made of material such as those described in reference to FIGS. 3A through 3D. Alternatively, no hard mask is necessary when the compliant pillars are photodefined.

Figure 13D:
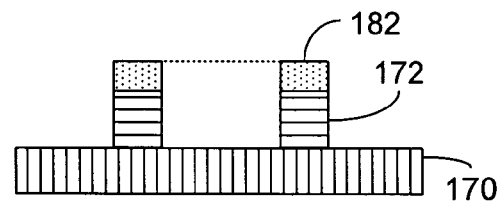
Figure 13E:
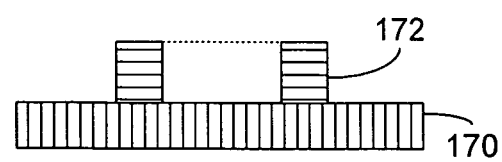

FIG. 13D illustrates the etching of the material layer 180, which forms the compliant socket 172. The material layer 180 can also be formed using techniques such as, for example, reactive ion etching (RIE), photo-definition, and laser drilling. FIG. 13E illustrates the removal of the mask 18.

Figure 13F:
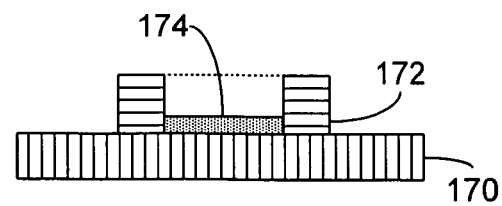

FIG. 13F illustrates disposing a solder material 174 within the compliant socket. The solder material 174 can be disposed within the compliant socket 172 using techniques such as, for example, plating, screen/stencil printing, and bumping. The compliant socket 172 is adapted to receive at least a portion of the electrical I/O interconnect 159, which can be bound by the solder material 174.

Fabrication steps similar to that described above in reference to FIGS. 3A through 3E can be used if the material layer is photosensitive.

Hybrid I/O Interconnect System

Figure 14A:
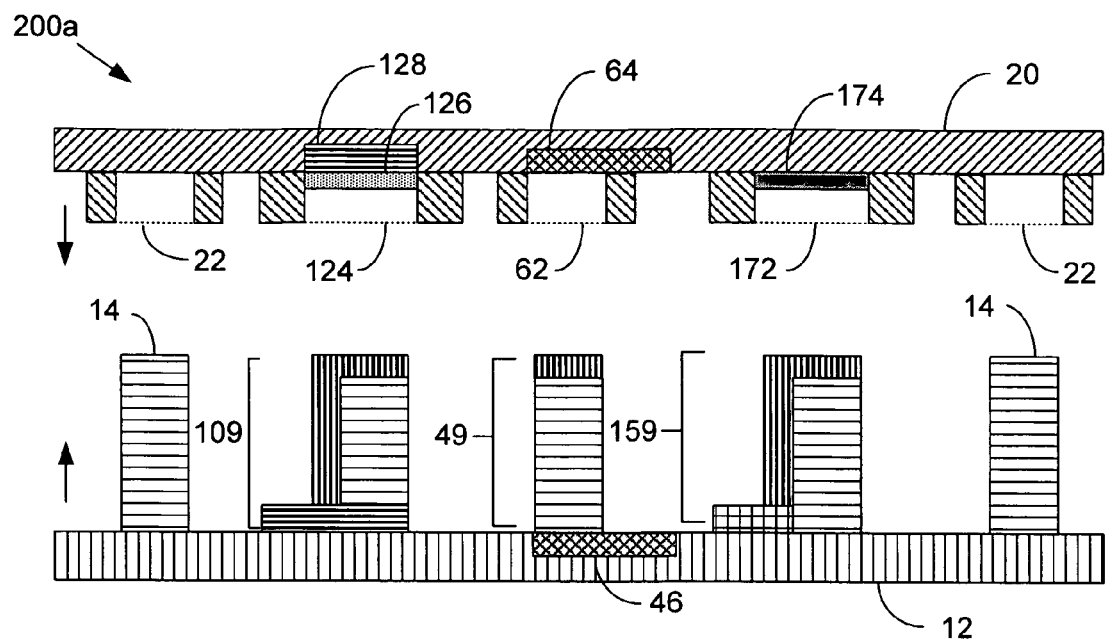
FIGS. 14A and 14B illustrate a hybrid I/O interconnect system, where
Figure 14B:
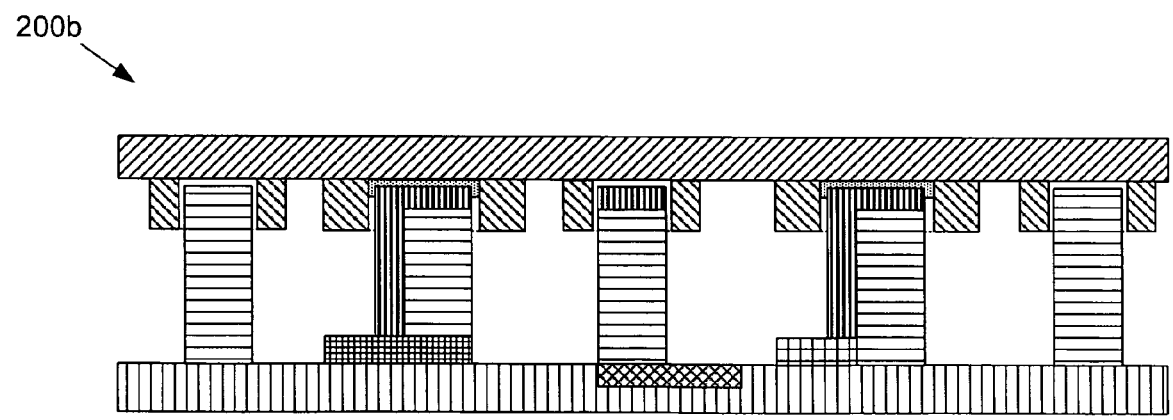

FIGS. 14A and 14B illustrate a hybrid I/O interconnect system 200, where FIG. 14A illustrates the first substrate 12 and the second substrate 20 spaced apart 200a. FIG. 14B illustrates the first substrate 12 and the second substrate 20 coupled together forming the component sets 200b. The first substrate 12 includes, but is not limited to, a pair of compliant pillars 14, a RF I/O interconnect 109, an optical I/O interconnect 49, and a electrical I/O interconnect 159.

The second substrate 20 includes, but is not limited to, compliant sockets 22, 124, 62, and 172 corresponding to the pair of compliant pillars 14, the RF I/O interconnect 109, the optical I/O interconnect 49, and the electrical I/O interconnect 159. The first substrate 12, second substrate 20, the compliant pillars 14, the RF I/O interconnect 109, the optical I/O interconnect 49, and the electrical I/O interconnect 159 are similar to the first substrates, second substrates, the compliant pillar, the RF I/O interconnect, the optical I/O interconnect, the electrical I/O interconnect, and their corresponding compliant sockets, as described above in reference to FIGS. 1A and 1B, 5A and 5B, 8A and 8B, and 11A and 11B.

The component sets of the hybrid I/O interconnect system 200 can be fabricated in a manner similar to the fabrication processes described above in reference to the descriptions of the compliant pillar 14, the RF I/O interconnect 109, the optical I/O interconnect 49, the electrical I/O interconnect 159 and the corresponding compliant socket 22, 124, 62, and 172.

Although only five component sets (e.g., the compliant pillars 14, the RF I/O interconnect 109, the optical I/O interconnect 49, and the electrical I/O interconnect 159, and the corresponding compliant sockets 22, 124, 62, and 172) are illustrated in FIGS. 14A and 14B, the hybrid I/O interconnect system can include additional component sets. An exemplar embodiment of the hybrid I/O interconnect system can include about 10 to about 100,000 component sets per $cm^2$, about 1000 to about 90,000 component sets per $cm^2$, about 5000 to about 50,000 component sets per $cm^2$, about 7500 to about 25,000 component sets per cm², and preferably about 10,000 to about 20,000 component sets per cm².

It should be emphasized that the above-described embodiments of the present invention are merely possible examples of implementations, merely set forth for a clear understanding of the principles of the invention. For example, the compliant pillars can be fabricated of multiple materials. The compliant pillars can also be used without the compliant sockets being on the board. In addition, the compliant sockets can be interconnected to other non-pillar like structures. Therefore, many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. An input/output (I/O) interconnect system, comprising:
a first substrate having at least one compliant pillar vertically extending from the first substrate, wherein the compliant pillar comprises a first material, wherein at least one compliant pillar is used as a vertical waveguide that is perpendicular to the first substrate, and wherein at least one compliant pillar has an electrical lead disposed upon a part of the compliant pillar, and wherein at least one compliant pillar has an RF lead disposed upon a part of the compliant pillar; and
a second substrate having a compliant socket adapted to receive at least one of the compliant pillars, wherein the compliant socket comprises a second material,
wherein the first substrate and the second substrate comprise a chip selected from the group consisting of a microprocessor chip, a communication chip, and an optoelectronic chip.

2. The I/O interconnect system of claim 1, wherein the first material comprises a low modulus material selected from the group consisting of polyimides, epoxides, polynorbornenes, polyarylene ethers, and parylenes.

3. The I/O interconnect system of claim 1, wherein the second material comprises a low modulus material selected from the group consisting of polyimides, epoxides, polynorbornenes, polyarylene ethers, and parylenes.

4. The I/O interconnect system of claim 1, wherein the compliant pillar has a height of about 15 to 300 micrometers.

5. The I/O interconnect system of claim 1, wherein the compliant pillar has a length of about 2 to 55 micrometers and a width of about 2 to 55 micrometers.

6. The I/O interconnect system of claim 5, wherein the compliant socket has a height of about 5 to 30 micrometers.

7. The I/O interconnect system of claim 1, wherein the compliant socket has a cross section selected from the group consisting of a substantially polygonal cross section, a substantially circular cross section, and a substantially elliptical cross section.

8. The I/O interconnect system of claim 1, wherein the compliant pillar and the compliant socket have different indexes of refraction.

9. The I/O interconnect system of claim 1, wherein the compliant socket includes a material that secures the compliant pillar to the compliant socket.

10. The I/O interconnect system of claim 1, further comprising an element selected from a diffractive grating coupler disposed on the compliant pillar used as a vertical waveguide and a mirror disposed on the compliant pillar used as a vertical waveguide.

11. The I/O interconnect system of claim 10, wherein the coupling element is selected from the group consisting of a volume grating coupling element and a surface relief grating coupling element.

12. The I/O interconnect system of claim 1, wherein the first substrate has from about 10 compliant pillars to about 100,000 compliant pillars per centimeter squared of the first substrate, and wherein the second substrate has from about 10 compliant sockets to about 100,000 compliant sockets per centimeter squared of the second substrate.

13. The I/O interconnect system of claim 1, wherein the compliant socket includes a solder material.

14. The I/O interconnect system of claim 1, wherein the compliant socket includes a high K-dielectric material.

15. An input/output (I/O) interconnect system, comprising:
a first substrate having at least one compliant pillar vertically extending from the first substrate, wherein the compliant pillar comprises a first material, wherein at least one compliant pillar is used as a vertical waveguide that is perpendicular to the first substrate, and wherein at least one compliant pillar has an electrical lead disposed upon a part of the compliant pillar, and wherein at least one compliant pillar has an RF lead disposed upon a part of the compliant pillar; and
a second substrate having a compliant socket adapted to receive at least one of the compliant pillar, wherein the compliant socket comprises a second material,
wherein the first substrate includes a first horizontal waveguide in optical communication with the vertical waveguide, wherein the second substrate includes a second horizontal waveguide in optical communication with the vertical waveguide, and wherein optical energy passes between the first horizontal waveguide and the second horizontal waveguide via the vertical waveguide.

16. The I/O interconnect system of claim 15, wherein the first material comprises a low modulus material selected from the group consisting of polyimides, epoxides, polynorbornenes, polyarylene ethers, and parylenes.

17. The I/O interconnect system of claim 15, wherein the second material comprises a low modulus material selected from the group consisting of polyimides, epoxides, polynorbornenes, polyarylene ethers, and parylenes.

18. The I/O interconnect system of claim 15, wherein the compliant pillar has a height of about 15 to 300 micrometers.

19. The I/O interconnect system of claim 15, wherein the compliant pillar has a length of about 2 to 55 micrometers and a width of about 2 to 55 micrometers.

20. The I/O interconnect system of claim 19, wherein the compliant socket has a height of about 5 to 30 micrometers.

21. The I/O interconnect system of claim 15, wherein the compliant socket has a cross section selected from the group consisting of a substantially polygonal cross section, a substantially circular cross section, and a substantially elliptical cross section.

22. The I/O interconnect system of claim 15, wherein the compliant pillar and the compliant socket have different indexes of refraction.

23. The I/O interconnect system of claim 15, wherein the compliant socket includes a material that secures the compliant pillar to the compliant socket.

24. The I/O interconnect system of claim 15, further comprising an element selected from the group consisting of a diffractive grating coupler disposed on the compliant pillar used as a vertical waveguide and a mirror disposed on the compliant pillar used as a vertical waveguide.

25. The I/O interconnect system of claim 24, wherein the coupling element is selected from the group consisting of a volume grating coupling element and a surface relief grating coupling element.

26. The I/O interconnect system of claim 15, wherein the first substrate has from about 10 compliant pillars to about 100,000 compliant pillars per centimeter squared of the first substrate, and wherein the second substrate has from about 10 compliant sockets to about 100,000 compliant sockets per centimeter squared of the second substrate.

27. The I/O interconnect system of claim 15, wherein the compliant socket includes a solder material.

28. The I/O interconnect system of claim 15, wherein the compliant socket includes a high K-dielectric material.

29. The I/O interconnect system of claim 15, wherein the first substrate and the second substrate comprise a chip selected from the group consisting of a microprocessor chip, a communication chip, and an optoelectronic chip.

* * * * *

UNITED STATES PATENT AND TRADEMARK OFFICE
CERTIFICATE OF CORRECTION

PATENT NO.          : 7,468,558 B2                                          Page 1 of 1
APPLICATION NO. : 11/416686
DATED                   : December 23, 2008
INVENTOR(S)         : Bakir et al.

It is certified that error appears in the above-identified patent and that said Letters Patent is hereby corrected as shown below:

Column 4, line 61, delete "as chip" and replace with

--as a chip--

Column 5, line 66, delete "socket 22 as" and replace with

--socket 22 has--

Column 7, line 6, delete "conditions are for" and replace with

--conditions for--

Column 12, line 4, delete "VECSEL of LED" and replace with

--VECSEL or LED--

Column 13, line 5, delete "pillar and the on" and replace with

--pillar and on--

Column 17, line 27, delete "about 2 and about" and replace with

--about 2 to about--

Signed and Sealed this

Seventeenth Day of February, 2009

JOHN DOLL
*Acting Director of the United States Patent and Trademark Office*